United States Patent [19]

Piper

[11] Patent Number: 4,463,323

[45] Date of Patent: Jul. 31, 1984

[54] WOVEN LOW IMPEDANCE ELECTRICAL TRANSMISSION CABLE AND METHOD

[75] Inventor: Douglas E. Piper, Greenville, S.C.

[73] Assignee: Woven Electronics Corporation, Greenville, S.C.

[21] Appl. No.: 410,580

[22] Filed: Aug. 23, 1982

[51] Int. Cl.³ .............................................. H01P 3/00
[52] U.S. Cl. .................................... 333/1; 174/117 M; 139/425 R; 333/243; 333/236
[58] Field of Search ......................... 333/236, 243, 1; 174/117 M; 139/425 R; 339/143 R

[56] References Cited

U.S. PATENT DOCUMENTS

| | | | |
|---|---|---|---|
| 3,447,120 | 5/1969 | Rask et al. | 333/1 X |
| 3,459,879 | 8/1969 | Gerpheide | 333/1 X |
| 3,763,306 | 10/1973 | Marshall | 333/243 X |
| 4,143,236 | 3/1979 | Ross et al. | 174/117 M X |

Primary Examiner—Paul L. Gensler
Attorney, Agent, or Firm—Dority & Flint

[57] ABSTRACT

A woven electrical transmission cable A is illustrated which includes a plurality of warp elements (12, 12, 14) interwoven with a weft element (16). A number of the warp elements are ground conductors (10) and a number are signal conductors (12). The ground and signal conductors are arranged in clusters (D, E) which include signal conductor pairs (12a, 12b and 12c, 12d) isolated by ground conductors (10a–10c and 10d–10f), respectively. An input signal is split at the input (20, 24) of the cluster between the signal conductor pair which is then combined at the output to provide a single output signal (28, 30). The location of the ground conductors relative to the signal conductors is fixed in the cable by interweaving of the weft (16) and warp binder yarns (14) together with the warp conductors (10, 12) whereby the characteristic impedance is controlled.

13 Claims, 6 Drawing Figures

WOVEN LOW IMPEDANCE ELECTRICAL TRANSMISSION CABLE AND METHOD

BACKGROUND OF THE INVENTION

The invention relates to electrical transmission cables of the type which are woven and typically include a plurality of conductor elements extending in a warp direction of the cable which transmit high frequency signals. Woven cables of this type are being utilized more and more in computer systems, communications systems, and other sophisticated electronic systems. The controlling of the characteristic impedance of the cable so that the impedance of the cable and the input are matched so that a representative and error free output signal is produced is a problem to which much attention must be given. The need for controlling the impedance becomes more acutely necessary when considering the fast operating speeds of present sophisticated electronic equipment wherein the rise time of the switching pulses is faster than one nanosecond. If the characteristic impedance of the cable is not controlled accurately so that the impedance of the line driver and the cable are matched, ringing in the output signal can occur which results in false triggering or other erroneous signals being produced at the output.

Prior attempts to provide controlled impedance cables in flat flexible type cables of the non-woven type are illustrated in U.S. Pat. Nos. 3,634,782 and 3,818,117.

U.S. Pat. No. 4,143,236 illustrates a woven controlled impedance cable wherein each signal line is provided with a ground conductor on each side thereof to control the impedance. The signal conductors are woven in an undulating woven pattern in the cable. The relative distances between the ground and signal conductors are fixed by the woven warp and weft yarns in the cable. The characteristic impedance of the cable is thus accurately controlled.

The spacing between the ground wires on either side of the signal wire and the signal wire itself determines to a large extent the characteristic impedance of the cable. The closer the ground wires are brought towards the signal wire, the lower the impedance of the cable. The relative distances between the ground and signal conductors are fixed by the woven warp and weft yarns in the cable. The characteristic impedance of the cable is thus accurately controlled. However, a problem exists in such a woven construction, which also includes warp binder yarns between the signal and ground conductors, in that there is a limit to the closeness in the positioning of the ground wires next to the signal wires due to this woven construction. Thus, the characteristic impedance of the cable reaches a point below which lower impedances are difficult to provide in the woven cable.

Accordingly, an important object of the present invention is to provide a woven electrical transmission cable having a low characteristic impedance value and method therefore.

Another important object of the present invention is to provide a woven transmission cable having a controlled characteristic impedance which may be lower than heretofore provided in a woven cable construction.

Still another important object of the present invention is to provide a woven transmission cable having a low characteristic impedance value in which cross-talk between the signal wires is reduced.

SUMMARY OF THE INVENTION

The above objectives are accomplished according to the present invention by providing a woven high frequency transmission cable which includes a plurality of warp elements extending in a warp direction in the cable and a weft element woven with the warp elements in a weft direction in the cable. A number of the warp elements are conductor elements which include signal conductors and ground conductors. By arranging the signal and ground conductors in clusters, and by splitting each transmission signal between a pair of the signal conductors in the cluster, the impedance of the cable may be substantially lowered. The characteristic impedance of the cable may still be accurately controlled by fixing the position of the signal and conductor warp elements in the woven pattern of the cable. In a preferred embodiment, each cluster includes a first ground conductor, a first signal conductor, a second ground conductor, a second signal conductor, and a third ground conductor, arranged in juxtaposed relation with respect to one another. A plurality of the clusters are woven in the cable in juxtaposed relation across the weft direction of the cable. The signal conductors of each cluster are woven in an undulating pattern in phase with one another. The signal conductors of adjacent clusters undulate out of phase with one another so that cross-talk between the signal conductors of adjacent clusters is reduced.

BRIEF DESCRIPTION OF THE DRAWINGS

The construction designed to carry out the invention will be hereinafter described, together with other features thereof.

The invention will be more readily understood from a reading of the following specification and by reference to the accompanying drawings forming a part thereof, wherein an example of the invention is shown and wherein.

DESCRIPTION OF A PREFERRED EMBODIMENT

Figure 1:
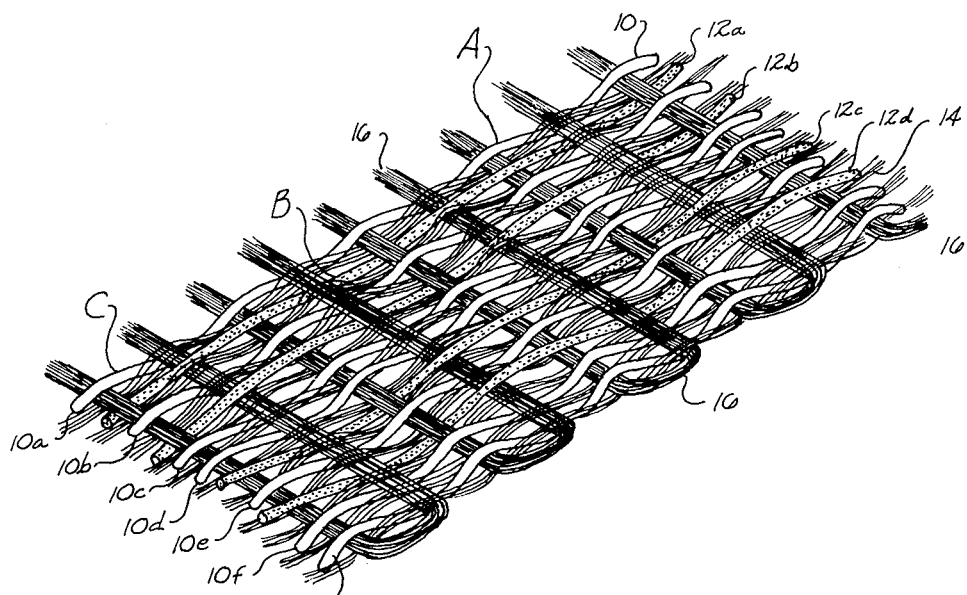
FIG. 1 is a perspective view of a woven low impedance transmission cable constructed according to the present invention.

Referring now in more detail to the drawings, FIG. 1 illustrates a woven transmission cable which may be woven on a conventional loom as is well known in the weaving art. The woven cable includes a plurality of warp elements which include a number of ground conductors 10 and a plurality of signal conductors 12. The warp elements further include a number of warp binder yarns 14 woven together with the warp elements 10 and 12 and a weft element 16. The warp elements are illustrated as being woven with the weft elements 16 in an undulating pattern that will be more fully described hereinafter. The warp binder yarns 14 and weft yarns 16 may be any suitable yarn such as Nomex brand nylon with each element 14 and 16 being a bundle of yarns.

Figure 3:
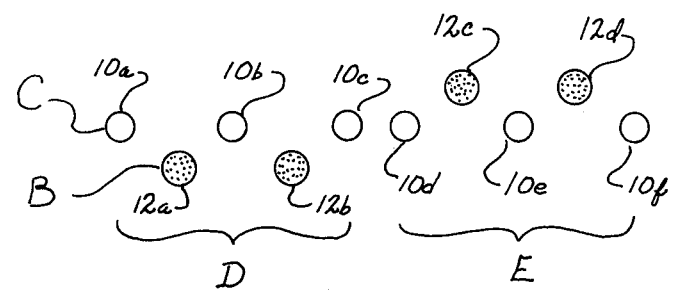
FIG. 3 is a schematic section of a view taken along line 3—3 of FIG. 2.

The warp conductor elements are arranged in clusters as can best be seen in FIG. 3 wherein a first cluster D and a second cluster E are illustrated in juxtaposed relation. Cluster D includes a first ground conductor element 10a, a first signal conductor element 12a, a second ground conductor element 10b, a second signal conductor element 12b, and a third ground conductor element 10c. Likewise, cluster E includes a first ground conductor element 10d, first signal conductor element 12c, a second ground conductor element 10e, a second signal conductor element 12d, and a third ground conductor element 10f.

As many clusters as desired may be arranged in juxtaposed relation across the weft direction and woven in the cable. Each cluster would contain the ground conductors and signal conductors as described above for clusters D and E.

Figure 6:
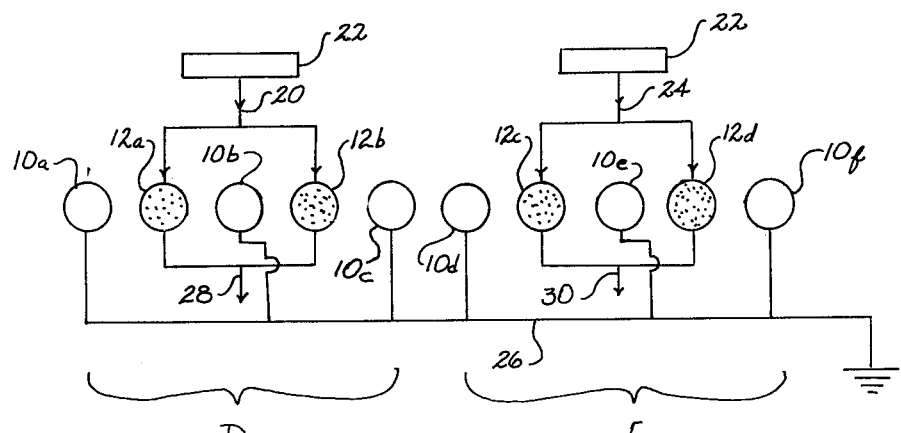
FIG. 6 is a schematic view of a woven cable having clusters of conductors having ground conductors fixing the impedance of the cable and a pair of signal conductors between which an input signal is split to provide a low characteristic impedance according to the invention.

As illustrated in FIG. 3, each cluster, such as D, includes a pair of signal conductors, such as 12a and 12b. The signal conductors are input by a single input signal 20 (FIG. 6) which is split between the conductor pairs 12a and 12b. The conductors 12a and 12b are terminated such that the signal is output as a single output signal representing the input signal 20. An input means such as a line driver 22 may provide the input signal to the cluster. Cluster E likewise includes a line drive input at 24 which is a single signal that is split between the signal conductor pairs 12c and 12d. By isolating the signal conductors in each cluster by means of a ground conductor on either side thereof, the impedance of the signal conductors is fixed whereby the overall impedance characteristic of the cable may be controlled and fixed. The grounds may be terminated at a common ground plane 26 in a conventional manner. The signal conductor pair of each cluster D, E is terminated to combine the split input signal and provide a single output signal at outputs 28 and 30, respectively.

Figure 2:
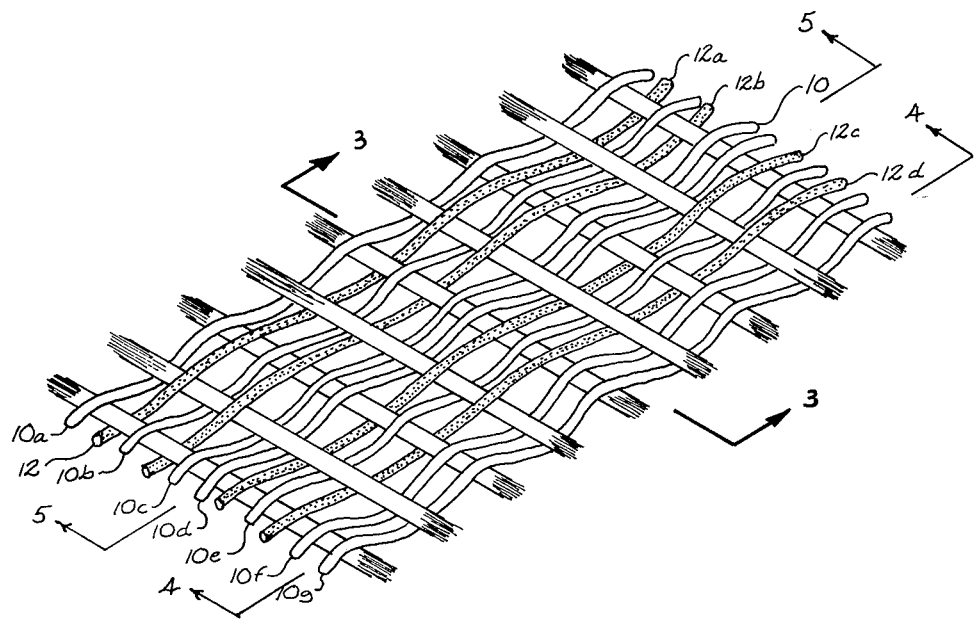
FIG. 2 is an enlarged perspective view with the warp binder yarns omitted illustrating the construction and method of the present invention wherein the ground and signal conductors extending in the warp direction are formed as clusters in the woven pattern of the cable.
Figure 4:
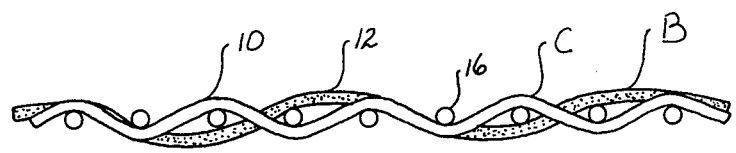
FIG. 4 is a sectional view taken along line 4—4 of FIG. 2.
Figure 5:
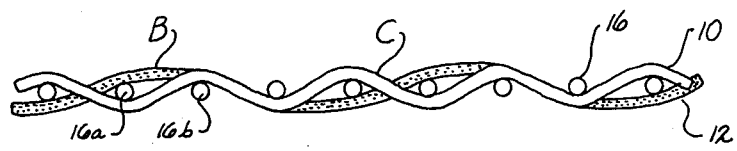
FIG. 5 is a sectional view taken along line 5—5 of FIG. 2.

It is preferred that the signal conductors such as 12a and 12b in cluster D of each cluster undulate in the woven pattern in phase with one another as can best be seen in FIGS. 2 and 4-5. In this manner, the single signal which is input at 20 is split between the conductors and travels in phase until it is output again as a single signal. The adjacent signal conductors in adjacent clusters such as 12a, 12b and 12c, 12d of clusters D and E are, however, woven so as to undulate approximately one hundred and eighty degrees out of phase with each other. This provides for woven fabric stability and minimization of cross-talk between adjacent signal pairs and adjacently transmitted signals. As illustrated, the signal conductors are woven over two picks of the weft element 16, such as 16a and 16b, in an over and under pattern as can best be seen in FIGS. 4 and 5. The ground conductor 10, however, alternates and undulates over and under each single pick such 16b of the weft yarn elements. The conductor elements B and C may be terminated by proper terminal connections as is well known in the art by any suitable terminal connector.

Thus, it can be seen that an advantageous construction can be had for a woven high frequency transmission cable whereby a low impedance characteristic value can be provided in a woven cable construction utilizing the space available for the weaving of the cable in a conventional manner on the loom. The positions of the signal and ground conductors in the woven cable are fixed in the woven pattern of the cable such that their position does not shift during use and such that the positioning of the various conductors is maintained at all times so that the impedance characteristic is not varied but is maintained constant. Thus, with the impedance characteristic of the cable constant, the impedance of the line driver and cable may be matched with reliability whereby the output signal is representative of the input signal without error. The lower impedance of the cable means that less power is required to drive and deliver the signal through the cable.

While a preferred embodiment of the invention has been described using specific terms, such description is for illustrative purposes only, and it is to be understood that changes and variations may be made without departing from the spirit or scope of the following claims.

What is claimed is:

1. A woven electrical transmission cable having a low impedance characteristic for transmitting high frequency signals comprising:
   a plurality of warp elements extending longitudinally in a warp direction in said cable;
   a weft element woven with said warp elements in a weft direction to define a weave pattern;
   a number of said warp elements being electrical signal conductors for transmitting said signals;
   a number of said warp elements being electrical ground conductors;
   a cluster of said conductors defined by a first ground conductor, a first signal conductor, a second ground conductor, a second signal conductor and a third ground conductor all of said conductors being arranged in order in side-by-side juxtaposed relation;
   said ground wires effectively isolating said signal conductors in each said cluster to control the impedance thereof;
   a plurality of said clusters arranged in juxtaposed position across the weft direction in said cable; and
   each said cluster adapted for receiving a single input signal which is split between said first and second signal conductors and output as a single signal from said cluster.

2. The transmission cable of claim 1 wherein a number of said warp elements are warp binder yarns woven with said weft element.

3. The transmission cable of claim 1 wherein said warp conductors are woven up and down with said weft element in a sinusoidal undulating pattern in said cable, said first and second signal conductors being woven in phase with one another within each said cluster.

4. The transmission cable of claim 1 wherein said first and second signal conductors undulate up and down in said weave pattern and are in phase with one another within each said cluster while said signal conductors of adjacent clusters undulate out of phase with one another.

5. The transmission cable of claim 4 wherein said signal conductors of adjacent clusters undulate approximately one-hundred and eighty degrees out of phase.

6. The transmission cable of claim 1 wherein a number of said warp elements are warp binder yarns woven with said weft element between adjacent conductors, said warp yarns and weft element weaving with said conductor warp elements for fixing the spacing of said warp ground conductors relative to said warp signal conductors in said weave pattern to thereby fix and control the impedance of said signal conductors and said cable.

7. A woven high frequency transmission cable having low impedance characteristics comprising:

a plurality of conductors extending in the warp direction in the cable;

said warp conductors being arranged in juxtapoxed relation across the weft direction of said woven cable;

a cluster of said conductors being defined by a pair of signal conductors arranged to carry a high frequency transmission signal, and a number of said conductors arranged to be ground conductors effectively isolating and fixing the impedance of said signal conductors in said cluster;

input means for inputting a single high frequency transmission signal to said cluster and splitting said signal between said pair of signal conductors;

output means for outputting said split signals as a single output signal at a terminal of said cluster; and a plurality of said clusters arranged in juxtaposed position across the weft direction of said woven cable.

8. The woven cable of claim 7 wherein said signal conductors in each cluster undulate up and down in a sinusoidal pattern and phase with one another.

9. The woven cable of claim 8 wherein said signal conductors of adjacent clusters undulate up and down in a sinusoidal pattern approximately one hundred and eighty degrees out of phase with each other.

10. A method of constructing a woven high frequency transmission cable having a controlled low impedance characteristic comprising:

weaving a number of warp elements extending longitudinally in a warp direction in said cable with a weft element in a weft direction to define a woven pattern;

providing a number of said warp elements as conductors in said cable;

arranging said conductor warp elements in clusters within said woven cable defined by a first ground conductor, a first signal conductor, a second ground conductor, a third signal conductor, and a third ground conductor being arranged side-by-side in juxtaposed relation across the weft direction of said cable;

terminating said first and second signal conductors of each cluster to provide an input which receives a single input signal which is split between said first and second signal conductors;

terminating an output of said signal conductors to provide a cluster output which combines said split signals and outputs said split signals as a single output signal;

providing a plurality of said clusters woven in juxtaposed position across the weft direction of said cable.

11. The method of claim 10 including weaving said warp elements with said weft element in an undulating pattern such that said signal conductors undulate up and down over said weft element in an undulating manner in said woven pattern.

12. The method of claim 10 including weaving said first and second signal conductors of each cluster up and down about said weft element in an undulating pattern in phase with one another.

13. The method of claim 11 including weaving said warp conductor elements with said weft elements in said woven pattern causing said first and second signals of adjacent clusters to be approximately one hundred and eighty degrees out of phase with one another in said undulating pattern.

* * * * *